United States Patent
Hsiao et al.

(10) Patent No.: US 8,580,589 B1
(45) Date of Patent: Nov. 12, 2013

(54) WAFER-LEVEL PROCESS FOR FABRICATING PHOTOELECTRIC MODULES

(75) Inventors: Hsu-Liang Hsiao, Changhua County (TW); Chun-Chiang Yen, Hsinchu (TW); Guan-Fu Lu, Taichung (TW)

(73) Assignee: Centera Photonics Inc., Hsinchu (TW)

( * ) Notice: Subject to any disclaimer, the term of this patent is extended or adjusted under 35 U.S.C. 154(b) by 0 days.

(21) Appl. No.: 13/471,460

(22) Filed: May 15, 2012

(51) Int. Cl.
*H01L 21/00* (2006.01)
*H01L 21/50* (2006.01)
*H01L 21/48* (2006.01)
*H01L 21/44* (2006.01)

(52) U.S. Cl.
USPC ............... 438/27; 438/33; 438/65; 438/113; 438/118

(58) Field of Classification Search
USPC ................... 438/27, 33, 65, 113, 118
See application file for complete search history.

(56) References Cited

U.S. PATENT DOCUMENTS

| | | | | |
|---|---|---|---|---|
| 6,806,557 B2* | 10/2004 | Ding | | 257/659 |
| 2009/0154872 A1* | 6/2009 | Sherrer et al. | | 385/14 |
| 2010/0159621 A1* | 6/2010 | Kimura et al. | | 438/27 |
| 2011/0158273 A1* | 6/2011 | Okayama et al. | | 372/43.01 |

* cited by examiner

*Primary Examiner* — Luan C Thai
(74) *Attorney, Agent, or Firm* — Jianq Chyun IP Office

(57) ABSTRACT

A wafer-level process for fabricating a plurality of photoelectric modules is provided. The wafer-level process includes at least following procedures. Firstly, a wafer including a plurality of chips arranged in an array is provided. Next, a plurality of photoelectric devices are mounted on the chips. Next, a cover plate including a plurality of covering units arranged in an array is provided. Next, a plurality of light guiding mediums are formed over the cover plate. Next, the cover plate is bonded with the wafer by an adhesive, wherein each of the covering units covers and bonds with one of the chips, and the light guiding mediums are sandwiched between the cover plate and the wafer. Then, the wafer and the cover plate are diced to obtain the plurality of photoelectric modules.

17 Claims, 5 Drawing Sheets

WAFER-LEVEL PROCESS FOR FABRICATING PHOTOELECTRIC MODULES

BACKGROUND OF THE INVENTION

1. Field of the Invention

The present invention generally relates to a fabricating process for fabricating photoelectric modules. More particularly, the present invention relates to a wafer-level fabricating process for fabricating photoelectric modules.

2. Description of Related Art

In recent years, with great advance in the photoelectric products development, semiconductor process is now widely used in fabricating all kinds of photoelectric modules. Its advancement is also towards smaller size, higher integrity and multiple functions. The photoelectric modules having been fabricated using semiconductor process include Charge-Coupled Device (CCD), CMOS Image Sensor (CIS), Solar Cell, Bio-Chip or other similar devices.

In order to transmit light between light guide device such as fiber, waveguide, etc. and photoelectric devices such as laser, light emitting diode (LED), photodiode, etc., the light guide devices and the photoelectric devices of the photoelectric modules need to be aligned precisely so as to perform the follow-up packaging process. Currently, the process for fabricating photoelectric modules is performed on each die and the alignment of photoelectric modules is performed under microscopes with specific fixtures. The manufacturing process is inefficient and wasteful in production capacity.

SUMMARY OF THE INVENTION

An embodiment of the present invention provides wafer-level process for fabricating a plurality of photoelectric modules. The wafer-level process includes at least following procedures. Firstly, a wafer including a plurality of chips arranged in an array is provided. Next, a plurality of photoelectric devices are mounted on the chips. Next, a cover plate including a plurality of covering units arranged in an array is provided. Next, a plurality of light guiding mediums are formed over the cover plate. Next, the cover plate is bonded with the wafer by an adhesive, wherein each of the covering units covers and bonds with one of the chips respectively, and the light guiding mediums are sandwiched between the cover plate and the wafer. Then, the wafer and the cover plate are diced to obtain the plurality of photoelectric modules.

According to an embodiment of the present invention, the wafer-level process further includes forming a plurality of optical lenses over the cover plate after forming the light guiding mediums, wherein each of the optical lenses is sandwiched between one of the chips and one of the covering units.

According to an embodiment of the present invention, the wafer-level process further includes forming a plurality of optical lenses over the cover plate, wherein the light guiding mediums and the optical lenses are formed simultaneously, and each of the optical lenses is sandwiched between one of the chips and one of the covering units.

According to an embodiment of the present invention, each of the chips includes at least one first bonding pad, at least one second bonding pad and at least one conductive via. The first bonding pad is disposed on a first surface of the chip. The second bonding pad is disposed on a second surface of the chip and the second surface is opposite to the first surface. The conductive via is disposed within the chip. The conductive via is electrically connected between the first bonding pad and the second bonding pad.

According to an embodiment of the present invention, the photoelectric devices are electrically connected with the first bonding pads by a plurality of conductive wires.

According to an embodiment of the present invention, the photoelectric devices are electrically connected with the first bonding pads by a plurality of conductive bumps.

According to an embodiment of the present invention, the adhesive includes a thermal-curable adhesive, a photo-curable adhesive or an air-set adhesive.

According to an embodiment of the present invention, a method for bonding the cover plate with the wafer includes dispensing the adhesive over the wafer or the cover plate, aligning the cover plate with the wafer by alignment keys formed on the wafer and the cover plate, and curing the adhesive to bond the cover plate with the wafer.

According to an embodiment of the present invention, the adhesive is entirely dispensed over the wafer or the cover plate.

According to an embodiment of the present invention, the adhesive is locally dispensed over the chips of the wafer or the covering units of the cover plate.

According to an embodiment of the present invention, the wafer-level process further includes a following procedure: a positioning assembly is formed between the cover plate and the wafer, wherein the cover plate and the wafer are aligned by the positioning assembly, and the positioning assembly includes convex portions and concave portions formed on the cover plate and the wafer correspondingly.

According to an embodiment of the present invention, an alignment accuracy of the positioning assembly is less than 3 micrometers.

According to an embodiment of the present invention, each of the covering units has a reflective surface for reflecting light signals emitted from the light guiding mediums or the photoelectric devices.

According to an embodiment of the present invention, each of the covering units further has a recess including a side surface, and the side surface is the reflective surface.

According to an embodiment of the present invention, each of the covering units has a plurality of grooves for accommodating the light guiding mediums.

According to an embodiment of the present invention, the light guiding mediums are waveguides.

According to an embodiment of the present invention, materials of the wafer and the cover plate are semiconductor materials.

In light of the above, the embodiment of the present invention applies the wafer-level package (WLP) technology to the process of fabricating photoelectric modules. The wafer and the cover plate can be bonded and then the bonded wafer and cover plate are diced into a plurality of photoelectric module packages. Therefore, photoelectric modules can be mass produced and the processing time and costs of the photoelectric modules are substantially reduced. Moreover, with the alignment keys or positioning assembly formed on the wafer and the cover plate, the alignment process of the wafer and the cover plate can be performed easily and precisely, which further simplifies the process of the photoelectric modules.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Following exemplary embodiments with reference of figures are only used for describing the disclosure in detail. However, the disclosure can also be achieved through different implementations, which is not limited to the following embodiments.

In the figures referred to herein, sizes and relative sizes of different layers are probably exaggerated for clarity of illustration and are not necessarily drawn to scale.

Figure 1:
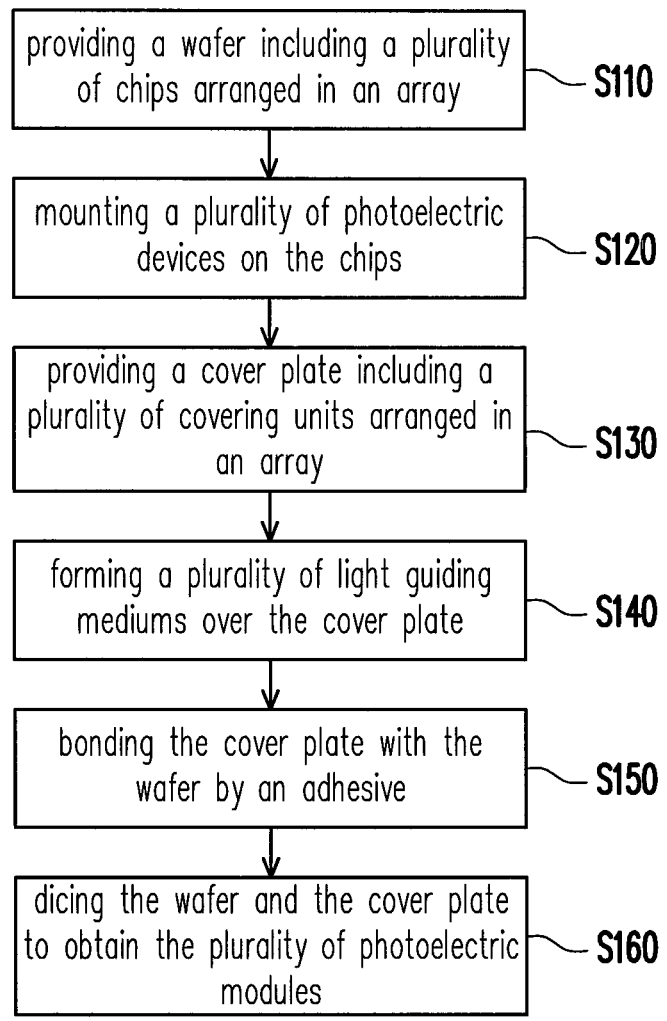
FIG. 1 is a schematic flowchart of a wafer-level process according to an embodiment of the present invention.
Figure 2:
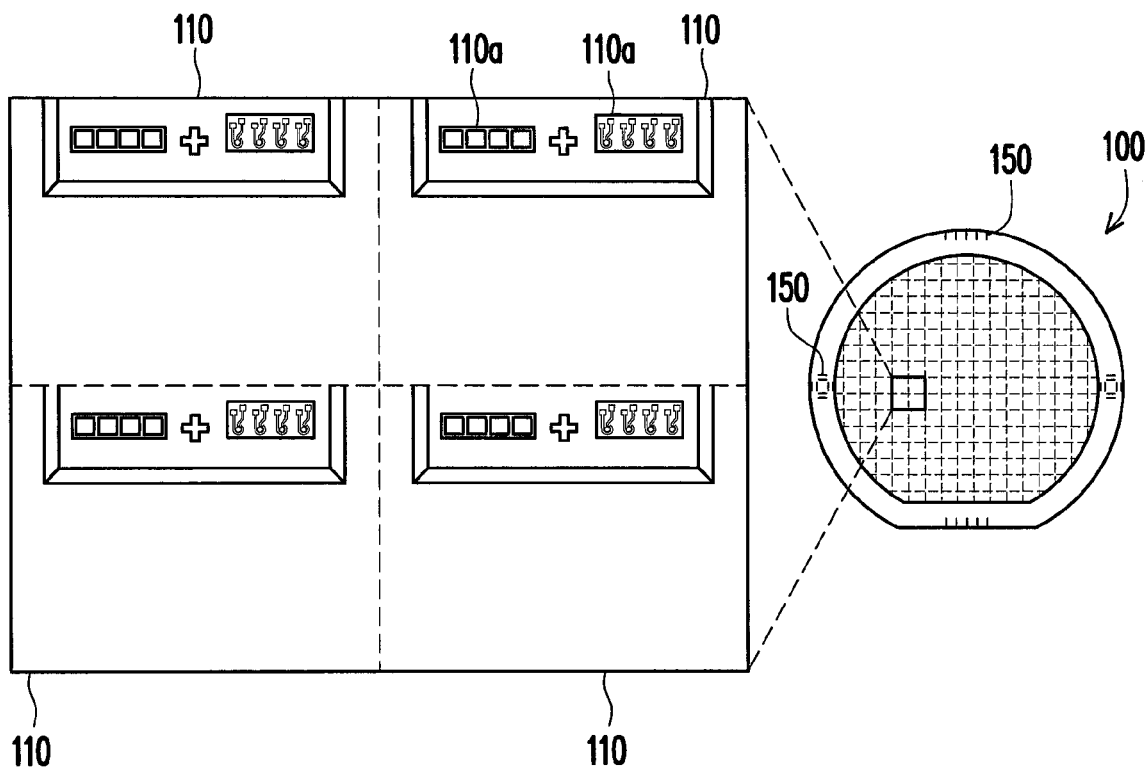
FIG. 2 is a schematic view of a wafer and the partial enlarged view thereof according to an embodiment of the present invention.

FIG. 1 is a schematic flowchart of a wafer-level process according to an embodiment of the present invention. FIG. 2 is a schematic view of a wafer and the partial enlarged view thereof according to an embodiment of the present invention.

Figure 3:
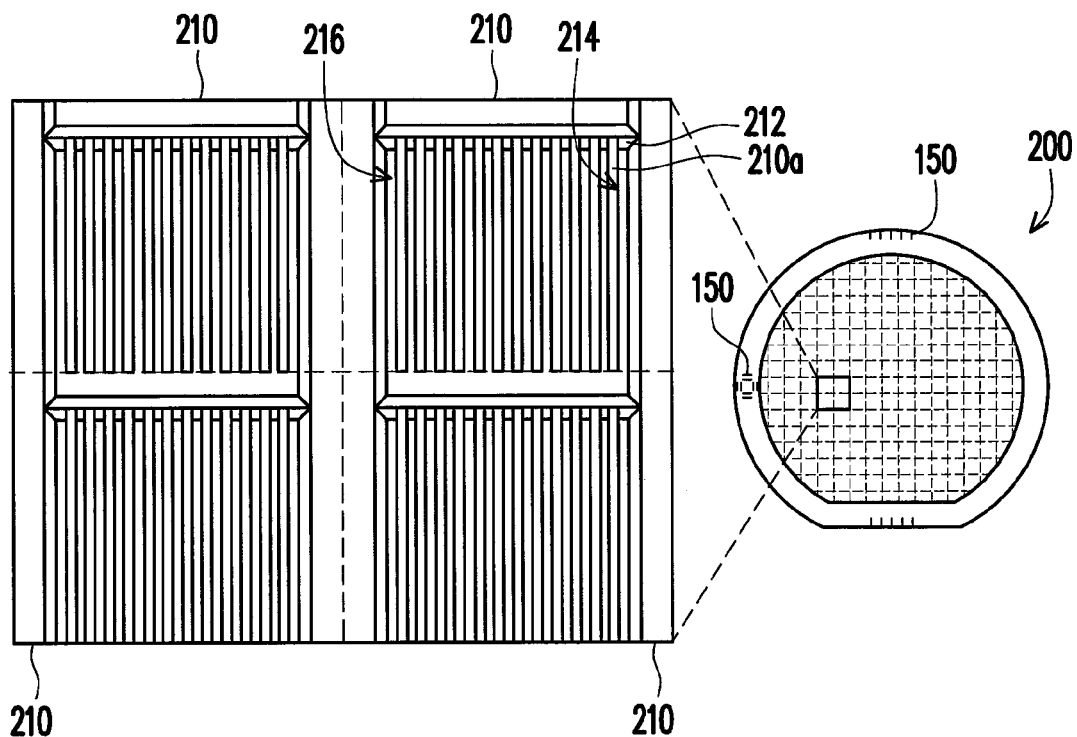
FIG. 3 is a schematic view of a cover plate and the partial enlarged view thereof according to an embodiment of the present invention.

FIG. 3 is a schematic view of a cover plate and the partial enlarged view thereof according to an embodiment of the present invention. Referring to FIG. 1 to FIG. 3, the wafer-level process of the embodiment of the present invention is suitable for fabricating a plurality of photoelectric modules. The wafer-level process includes at least following procedures. Firstly, in step S110, a wafer 100 including a plurality of chips 110 arranged in an array as shown in FIG. 2 is provided. Then, in step S120, a plurality of photoelectric devices 110a are mounted on the chips 110.

In detail, the photoelectric devices 110a can be mounted on and electrically connected with the chips 110 by a plurality of conductive bumps, i.e. flip chip process, or by a plurality of conductive wires, i.e. wire bonding process. The photoelectric devices 110a includes light emitting devices and photosensitive devices, wherein the light emitting device can be, for example, vertical cavity surface emitting laser (VCSEL) and the photosensitive device can be, for example, photodiode. It is noted that the examples mentioned above are for the purposes of illustration only and therefore should not be regarded as limiting. Rather, the present invention is not intended to limit the electrical connection manner or the types of the photoelectric devices 110a.

In step S130, a cover plate 200 including a plurality of covering units 210 arranged in an array as shown in FIG. 3 is provided. In the present embodiment, the materials of the wafer 100 and the cover plate 200 are semiconductor materials, for example but not limited to, silicon, aluminium, etc. Then, in step S140, a plurality of light guiding mediums 210a are formed over the cover plate 200. In the present embodiment, the light guiding mediums 210a are waveguides and can be formed by molding injection or photolithography technique, but the present invention is not limited thereto. In detail, each of the covering units 210 has a plurality of grooves 214 for accommodating the light guiding mediums 210a and a reflective surface 212 for reflecting the light signals emitted from the light guiding mediums 210a or the photoelectric devices 110a. In the present embodiment, each of the covering units 210 further has a recess 216 including a side surface, and the side surface is the reflective surface 212. The photoelectric devices 110a are configured to generate or receive the light signals and the reflective surface 212 is configured to reflect the light signals generated or received by the photoelectric devices 110a or the light signals transmitted by the light guiding mediums 210a.

Figure 4:
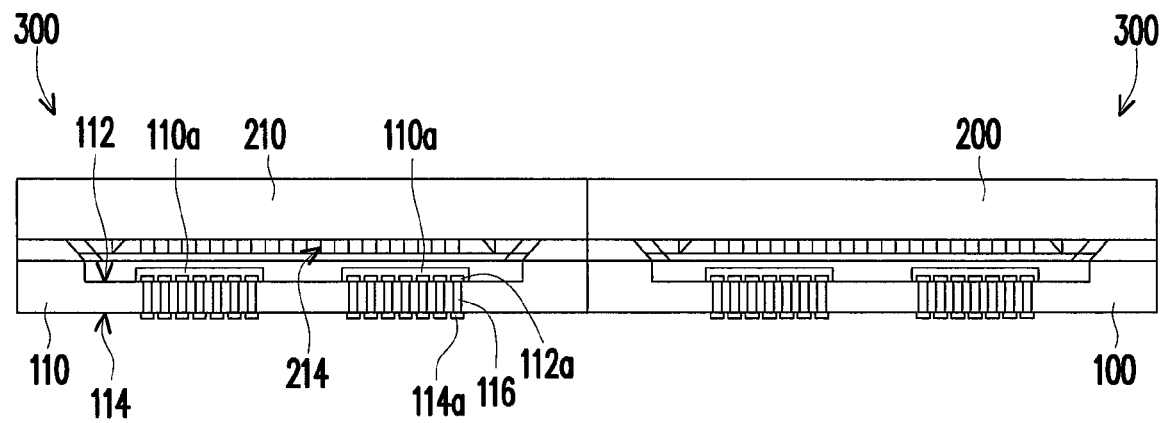
FIG. 4 is a cross-sectional view of the photoelectric modules according to an embodiment of the present invention.

FIG. 4 is a cross-sectional view of the photoelectric modules according to an embodiment of the present invention. Referring to FIG. 1 and FIG. 4, in step S150, the cover plate 200 is bonded with the wafer 100 by an adhesive, wherein each of the covering units 210 covers and bonds with one of the chips 110, and the light guiding mediums 210a are sandwiched between the cover plate 200 and the wafer 100. More specifically, in the present embodiment, the method for bonding the cover plate 200 with the wafer 100 includes: dispensing the adhesive over the wafer 100 or the cover plate 200, aligning the cover plate 200 with the wafer 100 by alignment keys 150 formed on the wafer 100 and the cover plate 200 as shown in FIG. 2 and FIG. 3, and then, curing the adhesive to bond the cover plate 200 with the wafer 100. The adhesive includes, for example but not limited to, a thermal-curable adhesive, a photo-curable adhesive or an air-set adhesive. The adhesive can be entirely dispensed over the wafer 100 or the cover plate 200, or be locally dispensed over the chips 110 of the wafer 100 or the covering units 210 of the cover plate 200. It is noted that the shape of the cover plate 200 is not limited to be equal to the shape of the wafer 100. Rather, the present invention is not intended to limit the shape of the cover plate 200 as long as all of the chips 110 on the wafer 100 can be covered and bonded with the corresponding covering units 210 on the cover plate 200.

Figure 5:
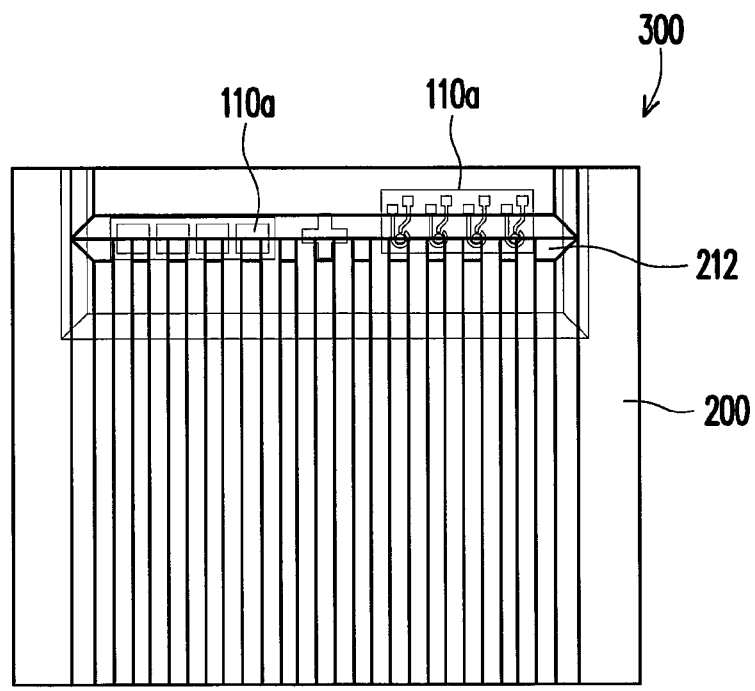
FIG. 5 is a top view of a single photoelectric module according to an embodiment of the present invention.

FIG. 5 is a top view of a single photoelectric module according to an embodiment of the present invention. For better and clearer illustration, the cover plate 200 in FIG. 5 is drawn with bold line and shown as a perspective view.

Referring to both FIG. 4 and FIG. 5, in step S160, performing the singularization process to the wafer 100 and the cover plate 200, which means the wafer 100 and the cover plate 200 are diced to obtain the plurality of photoelectric modules 300. The singularization process can be performed by, for example, mechanical or laser cutting. In the present embodiment, each chip 110 includes at least one first bonding pad 112a, at least one second bonding pad 114a, and at least one conductive via 116. The first bonding pad 112a is disposed on a first surface 112 of the chip 110 and the second bonding pad 114a is disposed on a second surface 114 of the chip 110, wherein the second surface 114 is opposite to the first surface 112. The conductive via 116 is disposed within the chip 110 and is electrically connected between the first bonding pad 112a and the second bonding pad 114a. The conductive via 116 is, for example, a through silicon via (TSV) and the chip 110 can be electrically connected to a carrier or other electronic component through the conductive via 116.

Figure 6:
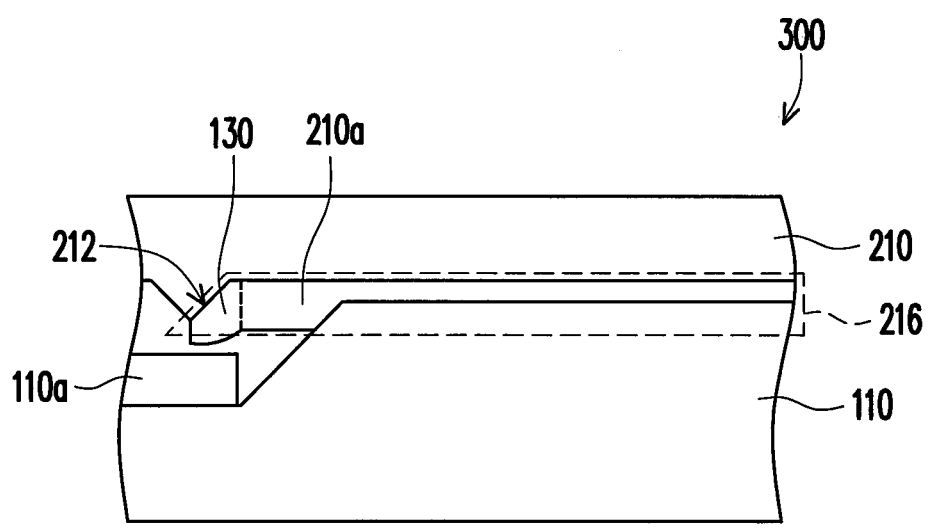
FIG. 6 is a partial cross-sectional view of a photoelectric module according to an embodiment of the present invention.

FIG. 6 is partial cross-sectional view of a photoelectric module according to an embodiment of the present invention. Referring to FIG. 6, in the present embodiment, the wafer-level process further includes: forming a plurality of optical lenses 130 over the cover plate (as the cover plate 200 shown in FIG. 3) after step S140 which is forming the light guiding mediums 210a. Each of the optical lenses 130 is sandwiched between one of the chips 110 and one of the covering units 210. It is noted that, the material of the light guiding mediums 210a is different from the material of the optical lenses 130 in the present embodiment. In other embodiment, when the material of the light guiding mediums 210a is the same as that of the optical lenses 130, the step of forming optical lenses 130 over the cover plate (as the cover plate 200 shown in FIG. 3) and step S140 can be performed simultaneously, that is to say, the light guiding mediums 210 and the optical lenses 130 are formed simultaneously, wherein one end of each light guiding medium 210a is connected to the optical lenses 130. The method for forming the light guiding mediums 210 and the optical lenses 130 can be, for example, molding injection technique. The refraction index of the optical lens 130 is greater than the refraction index of the air, so the light signals transmitted between the photoelectric devices 110a and the light guiding mediums 210a can be concentrated so as to enhance the coupling effect of the photoelectric module 300. Furthermore, the optical lens 130 can be formed by molding injection technique for mass production, the production time and cost of the photoelectric module 300 can thus be reduced.

Figure 7:
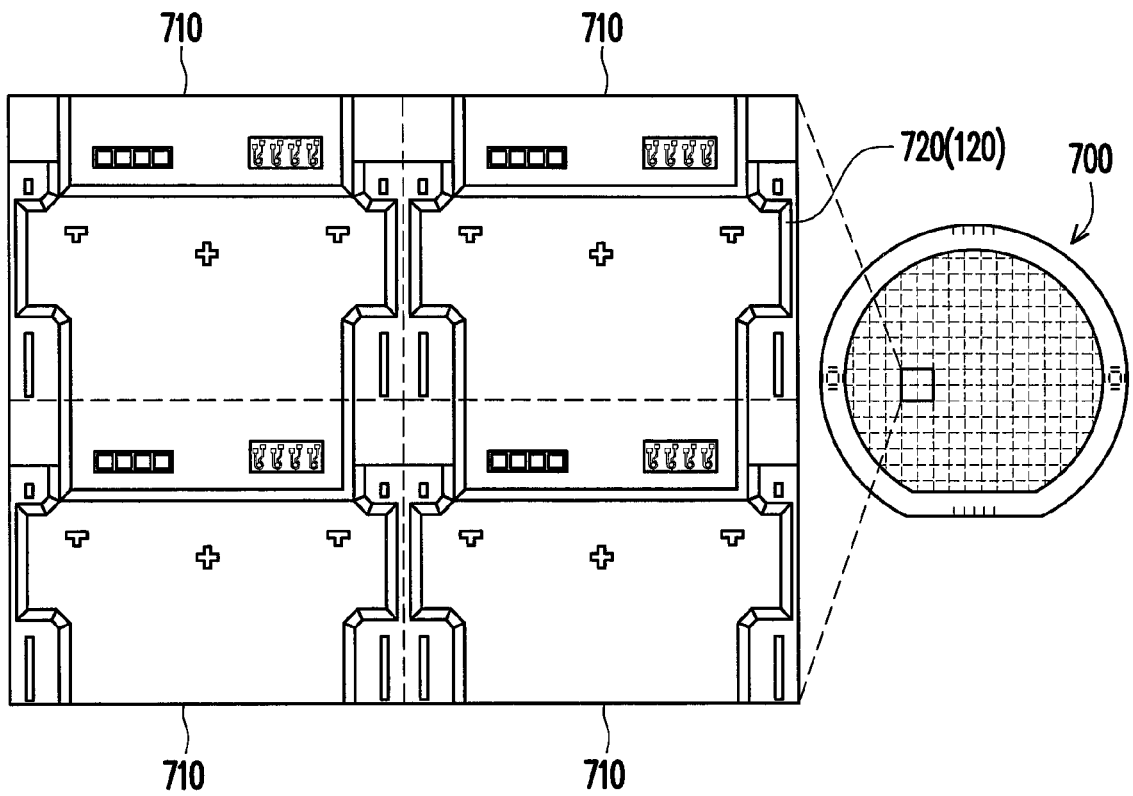
FIG. 7 is a schematic view of a wafer and the partial enlarged view thereof according to another embodiment of the present invention.
Figure 8:
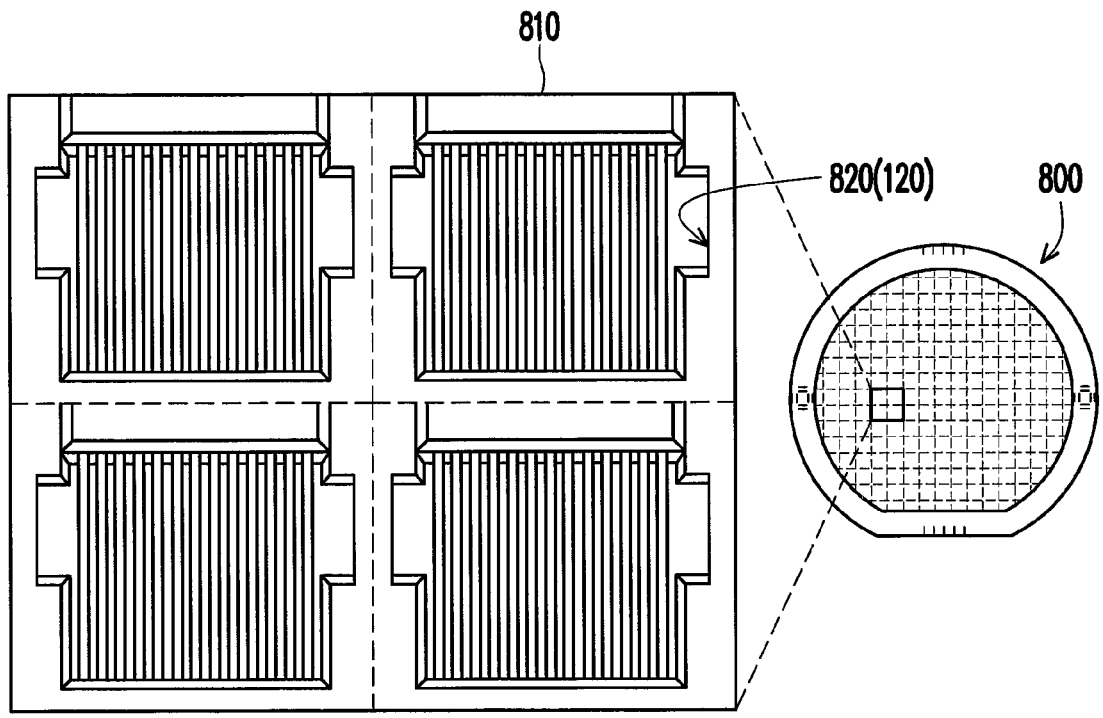
FIG. 8 is a schematic view of a cover plate and the partial enlarged view thereof according to another embodiment of the present invention.

FIG. 7 is a schematic view of a wafer and the partial enlarged view thereof according to another embodiment of the present invention. FIG. 8 is a schematic view of a cover plate and the partial enlarged view thereof according to another embodiment of the present invention. Referring to FIG. 7 and FIG. 8, the wafer-level process of the present embodiment and the previously disclosed wafer-level process are based on the similar concept with similar structures. The differences between the two embodiments are: the wafer-level process further includes the following procedure. A positioning assembly 120 is formed between the cover plate 800 and the wafer 700, wherein the cover plate 800 and the wafer 700 are aligned by the positioning assembly 120, and the positioning assembly includes convex portions 820 and concave portions 720 formed on the cover plate 800 and the wafer 700 correspondingly. In the embodiment, the convex portions 820 are formed on the cover plate 800 and the concave portions are formed on the wafer 700. More specifically, an alignment accuracy of the positioning assembly 120 is less than 3 micrometers. The convex portions 820 and the concave portions 720 are suitable for being engaged with each other and can be formed by etching or molding injection technique. The present invention is not limited to the shapes and the fabricating methods of the convex portions 820 and the concave portions 720.

In light of the foregoing, the present invention applies the wafer-level package (WLP) technology to the process of fabricating photoelectric modules. The wafer and the cover plate can be bonded and then the bonded wafer and cover plate are diced into many photoelectric module packages. Therefore, photoelectric modules can be mass produced and the processing time and costs of the photoelectric modules are substantially reduced. Moreover, with the alignment keys or positioning assembly formed on the wafer and the cover plate, the alignment process of the wafer and the cover plate can be performed easily and precisely, which further simplifies the process of the photoelectric modules.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer-level process for fabricating a plurality of photoelectric modules, the wafer-level process comprising:
   providing a wafer comprising a plurality of chips arranged in an array;
   mounting a plurality of photoelectric devices on the chips;
   providing a cover plate comprising a plurality of covering units arranged in an array;
   forming a plurality of light guiding mediums on the cover plate;
   bonding the cover plate with the wafer by an adhesive, wherein each of the covering units having the light guiding mediums formed thereon covers and bonds with one of the chips, such that the light guiding mediums formed on the cover plate are sandwiched between the cover plate and the wafer; and
   dicing the wafer and the cover plate to obtain the plurality of photoelectric modules.

2. The wafer-level process of claim 1, further comprising:
   forming a plurality of optical lenses over the cover plate after forming the light guiding mediums, wherein each of the optical lenses is sandwiched between one of the chips and one of the covering units.

3. The wafer-level process of claim 1, further comprising:
   forming a plurality of optical lenses over the cover plate, wherein the light guiding mediums and the optical lenses are formed simultaneously, and each of the optical lenses is sandwiched between one of the chips and one of the covering units.

4. The wafer-level process of claim 1, wherein each of the chips comprises:
   at least one first bonding pad disposed on a first surface of the chip;
   at least one second bonding pad disposed on a second surface of the chip, the second surface being opposite to the first surface; and
   at least one conductive via disposed within the chip, the conductive via being electrically connected between the first bonding pad and the second bonding pad.

5. The wafer-level process of claim 4, wherein the photoelectric devices are electrically connected with the first bonding pads by a plurality of conductive wires.

6. The wafer-level process of claim 4, wherein the photoelectric devices are electrically connected with the first bonding pads by a plurality of conductive bumps.

7. The wafer-level process of claim 1, wherein the adhesive comprises a thermal-curable adhesive, a photo-curable adhesive or an air-set adhesive.

8. The wafer-level process of claim 1, wherein a method for bonding the cover plate with the wafer comprises:
   dispensing the adhesive over the wafer or the cover plate;
   aligning the cover plate with the wafer by alignment keys formed on the wafer and the cover plate; and
   curing the adhesive to bond the cover plate with the wafer.

9. The wafer-level process of claim 8, wherein the adhesive is entirely dispensed over the wafer or the cover plate.

10. The wafer-level process of claim 1, wherein the adhesive is locally dispensed over the chips of the wafer or the covering units of the cover plate.

11. The wafer-level process of claim 1, further comprising forming a positioning assembly between the cover plate and the wafer, wherein the cover plate and the wafer are aligned by the positioning assembly, and the positioning assembly includes convex portions and concave portions formed on the cover plate and the wafer correspondingly.

12. The wafer-level process of claim 11, wherein an alignment accuracy of the positioning assembly is less than 3 micrometers.

13. The wafer-level process of claim 1, wherein each of the covering units has a reflective surface for reflecting light signals emitted from the light guiding mediums or the photoelectric devices.

14. The wafer-level process of claim 13, wherein each of the covering units further has a recess including a side surface, and the side surface is the reflective surface.

15. The wafer-level process of claim 1, wherein each of the covering units has a plurality of grooves for accommodating the light guiding mediums.

16. The wafer-level process of claim 1, wherein the light guiding mediums are waveguides.

17. The wafer-level process of claim 1, wherein materials of the wafer and the cover plate are semiconductor materials.

* * * * *